United States Patent
Gong

(10) Patent No.: US 10,284,943 B2
(45) Date of Patent: May 7, 2019

(54) METHOD AND APPARATUS FOR ADJUSTING SOUND FIELD OF AN EARPHONE AND A TERMINAL

(71) Applicant: ZTE Corporation, Shenzhen (CN)

(72) Inventor: Yong Gong, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 15/745,046

(22) PCT Filed: Sep. 23, 2015

(86) PCT No.: PCT/CN2015/090449
§ 371 (c)(1),
(2) Date: Jan. 15, 2018

(87) PCT Pub. No.: WO2016/131266
PCT Pub. Date: Aug. 25, 2016

(65) Prior Publication Data
US 2018/0213317 A1  Jul. 26, 2018

(30) Foreign Application Priority Data
Jul. 17, 2015  (CN) .......................... 2015 1 0422398

(51) Int. Cl.
*H03G 9/00* (2006.01)
*H04R 1/10* (2006.01)
(Continued)

(52) U.S. Cl.
CPC ................ *H04R 1/22* (2013.01); *H03G 9/00* (2013.01); *H04R 1/10* (2013.01); *H04R 29/001* (2013.01)

(58) Field of Classification Search
CPC ....... H04R 5/033; H04R 3/04; H04S 2420/01; H04S 1/005
(Continued)

(56) References Cited

U.S. PATENT DOCUMENTS

2010/0310101 A1* 12/2010 Anderson ................ A61B 5/11
381/309
2011/0135117 A1  6/2011 Nystrom et al.

FOREIGN PATENT DOCUMENTS

CN  101022269 A  8/2007
CN  101729958 A  6/2010
(Continued)

OTHER PUBLICATIONS

International Search Report Application No. PCT/CN2015/090449; dated Apr. 13, 2016; pp. 4.
(Continued)

*Primary Examiner* — Alexander Jamal
(74) *Attorney, Agent, or Firm* — Cantor Colburn LLP

(57) ABSTRACT

Provided are a method and apparatus for adjusting a sound field of an earphone, a terminal, and an earphone. The method includes acquiring a loudness data difference between first and second earplugs of an earphone connected to a terminal; determining a current sound field parameter of the earphone according to the loudness data difference; judging whether the current sound field parameter is substantially the same as a pre-set sound field parameter by comparison; and when the current sound field parameter is not the same as the pre-set sound field parameter, adjusting gain parameters of first and second channels of the terminal according to the current sound field parameter and the pre-set sound field parameter, so that the current sound field parameter of the earphone reaches the pre-set sound field parameter.

8 Claims, 3 Drawing Sheets

(51) Int. Cl.
*H04R 1/22* (2006.01)
*H04R 29/00* (2006.01)

(58) Field of Classification Search
USPC .................................. 381/98, 314, 321, 309
See application file for complete search history.

(56) References Cited

FOREIGN PATENT DOCUMENTS

| CN | 102892058 A | 1/2013 |
|----|-------------|--------|
| JP | 2013157960 A | 8/2013 |
| WO | 2012016527 A1 | 2/2012 |

OTHER PUBLICATIONS

European Search Report Application No. EP15882405 dated Jun. 4, 2018, pp. 9.

* cited by examiner

METHOD AND APPARATUS FOR ADJUSTING SOUND FIELD OF AN EARPHONE AND A TERMINAL

TECHNICAL FIELD

The present disclosure relates to the technical field of wearable devices, and more particularly to a method and apparatus for adjusting a sound field of an earphone and a terminal.

BACKGROUND

During the pre-research on terminal audio related new technology, it was discovered that users pay more and more attention to a terminal audio and have higher requirements for the terminal audio. The users not only have higher requirements for loudness, but also have a higher pursuit for a sound effect. A complete earphone audio path includes a motherboard hardware circuit of a terminal and an earphone. When the earphone and the motherboard hardware circuit cooperate to achieve a most reasonable state, an optimum listening effect can be obtained.

When designing respective products, a terminal manufacturer and an earphone manufacturer assume that audio functions of opposite products are designed under a certain state. Therefore, when listening to music on a portable device such as a mobile phone by using an earphone, a user often cannot obtain an ideal sound field, and cannot obtain a better user experience accordingly. Even if the earphone and the portable audio playing device are under an optimum matching state in default, a sound field environment needed by the user often cannot be provided due to different user habits.

During delivery, a sound field of an earphone on the current market has been adjusted, but the sound field of the earphone may be influenced by processing, via a hardware circuit of a portable audio playing device of an audio signal and the wearing position of the earphone, such that an optimum sound field is not achieved during music listening.

There are mainly two solutions for this problem at present as follows:

Solution 1: an audio signal of a left channel and an audio signal of a right channel are added together to form a single-channel signal, virtual reflecting sounds of the left and right channels are further generated, and an audio signal of a virtual sound field space is calculated and generated in conjunction with virtual sound field space positioning.

Solution 2: tracking is performed according to change of a current user position and an original optimum sound field space reference position, and the change situation is fed back to a sound playing device, such that the current user position is an optimum audio-visual sound field space.

In an embodiment, in the solution 1, higher requirements are made for music listening time, and the wearing gesture of the user will influence the accuracy of the virtual sound field space as well. In the solution 2, the original optimum sound field space of a space audio system is fixed, and a sound field needed by the user cannot be provided. To sum up, the two solutions cannot accurately adjust a sound field of an earphone.

SUMMARY

The embodiments of the present disclosure are directed to a method and apparatus for adjusting a sound field of an earphone, a terminal, and an earphone, capable of simply and accurately adjusting a sound field of an earphone.

To this end, the technical solutions are adopted as follows:

A method for adjusting a sound field of an earphone is provided, which is applied to a terminal and includes the following steps: a loudness data difference between left and right earplugs of an earphone connected to the terminal is acquired; a current sound field parameter of the earphone is determined according to the loudness data difference; it is judged whether the current sound field parameter is the same as a pre-set sound field parameter by comparison; when the current sound field parameter is not the same as the pre-set sound field parameter, gain parameters of left and right channels of the terminal are adjusted according to the current sound field parameter and the pre-set sound field parameter, so that the current sound field parameter of the earphone reaches the pre-set sound field parameter.

In an embodiment, the step that a loudness data difference between left and right earplugs of an earphone connected to the terminal is acquired includes the following sub-steps: first loudness data at the left earplug and second loudness data at the right earplug are received from the earphone; the loudness data difference between the left and right earplugs of the earphone connected to the terminal is obtained according to the first loudness data and the second loudness data.

In an embodiment, the step that first loudness data at the left earplug and second loudness data at the right earplug are received from the earphone includes the following sub-step: the first loudness data at the left earplug is received from the earphone under a first pre-set frequency, and the second loudness data at the right earplug is received from the earphone under a second pre-set frequency.

In an embodiment, before it is judged whether the current sound field parameter is the same as a pre-set sound field parameter by comparison, the method further includes the following steps: an adjustment instruction input by a user to adjust a sound field parameter is acquired; the pre-set sound field parameter is determined according to the adjustment instruction.

In an embodiment, the step that gain parameters of left and right channels of the terminal are adjusted according to the current sound field parameter and the pre-set sound field parameter includes the following sub-steps: a difference value between the current sound field parameter and the pre-set sound field parameter is determined according to the current sound field parameter and the pre-set sound field parameter; a first adjustment parameter of a smart audio amplifier in the left channel of the terminal and a second adjustment parameter of a smart audio amplifier in the right channel of the terminal are determined according to the difference value and a pre-set mapping function for determining an adjustment parameter of a smart audio amplifier; a gain parameter of the left channel is adjusted according to the first adjustment parameter, and a gain parameter of the right channel is adjusted according to the second adjustment parameter.

An apparatus for adjusting a sound field of an earphone is provided, which is applied to a terminal and includes a first acquisition module, a first determination module, a comparison module and an adjustment module.

The first acquisition module is configured to acquire a loudness data difference between left and right earplugs of an earphone connected to the terminal.

The first determination module is configured to determine a current sound field parameter of the earphone according to the loudness data difference;

The comparison module is configured to judge whether the current sound field parameter is the same as a pre-set sound field parameter by comparison.

The adjustment module is configured to adjust, when the current sound field parameter is not the same as the pre-set sound field parameter, gain parameters of left and right channels of the terminal according to the current sound field parameter and the pre-set sound field parameter, so that the current sound field parameter of the earphone reaches the pre-set sound field parameter.

In an embodiment, the first acquisition module includes a receiving unit and a first determination unit. The receiving unit is configured to receive first loudness data at the left earplug and second loudness data at the right earplug from the earphone, and the first determination unit is configured to obtain the loudness data difference between the left and right earplugs of the earphone connected to the terminal according to the first loudness data and the second loudness data.

In an embodiment, the receiving unit includes a first sub-unit, and the first sub-unit is configured to receive the first loudness data at the left earplug from the earphone under a first pre-set frequency, and receive the second loudness data at the right earplug from the earphone under a second pre-set frequency.

In an embodiment, the apparatus further includes a second acquisition module and a second determination module. The second acquisition module is configured to acquire an adjustment instruction input by a user to adjust a sound field parameter, and the second determination module is configured to determine the pre-set sound field parameter according to the adjustment instruction.

In an embodiment, the adjustment module includes a second determination unit, a third determination unit and an adjustment unit.

The second determination unit is configured to determine a difference value between the current sound field parameter and the pre-set sound field parameter according to the current sound field parameter and the pre-set sound field parameter.

The third determination unit is configured to determine a first adjustment parameter of a smart audio amplifier in the left channel of the terminal and a second adjustment parameter of a smart audio amplifier in the right channel of the terminal according to the difference value and a pre-set mapping function for determining an adjustment parameter of a smart audio amplifier.

The adjustment unit is configured to adjust a gain parameter of the left channel according to the first adjustment parameter, and adjust a gain parameter of the right channel according to the second adjustment parameter.

A terminal is provided, and the terminal includes an apparatus for adjusting a sound field of an earphone as mentioned in above embodiments.

A method for adjusting a sound field of an earphone is also provided, which applied to an earphone, and the method includes the following steps: first loudness data at a left earplug of the earphone and second loudness data at a right earplug are collected respectively, and the first loudness data and the second loudness data are output.

In an embodiment, after first loudness data at a left earplug of the earphone and second loudness data at a right earplug are collected respectively, the method further includes the following steps: a loudness data difference between the left and right earplugs of the earphone is obtained according to the first loudness data and the second loudness data, and the loudness data difference is sent to a terminal.

In an embodiment, the step that the first loudness data and the second loudness data are output includes the sub-step: the first loudness data and the second loudness data are output to the terminal connected to the earphone.

In an embodiment, the step that the first loudness data and the second loudness data are output to the terminal connected to the earphone includes the sub-step: the first loudness data at the left earplug of the earphone is sent to the terminal under a first pre-set frequency, and the second loudness data at the right earplug of the earphone is sent to the terminal under a second pre-set frequency.

An apparatus for adjusting a sound field of an earphone is provided, which is applied to an earphone and includes a collection module and an output module.

The collection module is configured to collect first loudness data at a left earplug of the earphone and second loudness data at a right earplug respectively, and the output module is configured to output the first loudness data and the second loudness data.

In an embodiment, the apparatus further includes a third determination module and a sending module. The third determination module is configured to obtain a loudness data difference between the left and right earplugs of the earphone according to the first loudness data and the second loudness data, and the sending module is configured to send the loudness data difference to a terminal.

In an embodiment, the output module includes an output unit, and the output unit is configured to output the first loudness data and the second loudness data to the terminal connected to the earphone.

In an embodiment, the output unit includes an output sub-unit. The output sub-unit is configured to send the first loudness data at the left earplug of the earphone to the terminal under a first pre-set frequency, and send the second loudness data at the right earplug of the earphone to the terminal under a second pre-set frequency.

An earphone is provided, which includes the apparatus for adjusting a sound field of an earphone at an earphone side as mentioned in above embodiments.

The above-mentioned solutions of the present disclosure at least include the following beneficial effects:

In the embodiments of the present disclosure, by means of an acquired loudness data difference between left and right earplugs of an earphone, a current sound field parameter of the earphone is determined, the current sound field parameter is compared with a pre-set sound field parameter, and when the current sound field parameter is different from the pre-set sound field parameter, gain parameters of left and right channels of a terminal are adjusted, so that the current sound field parameter of the earphone reaches the pre-set sound field parameter. The problem of inaccurate adjustment of a sound field of an earphone is solved, thereby achieving the effect of simply and accurately adjusting a sound field of an earphone.

DETAILED DESCRIPTION OF THE EMBODIMENTS

Figure 1:
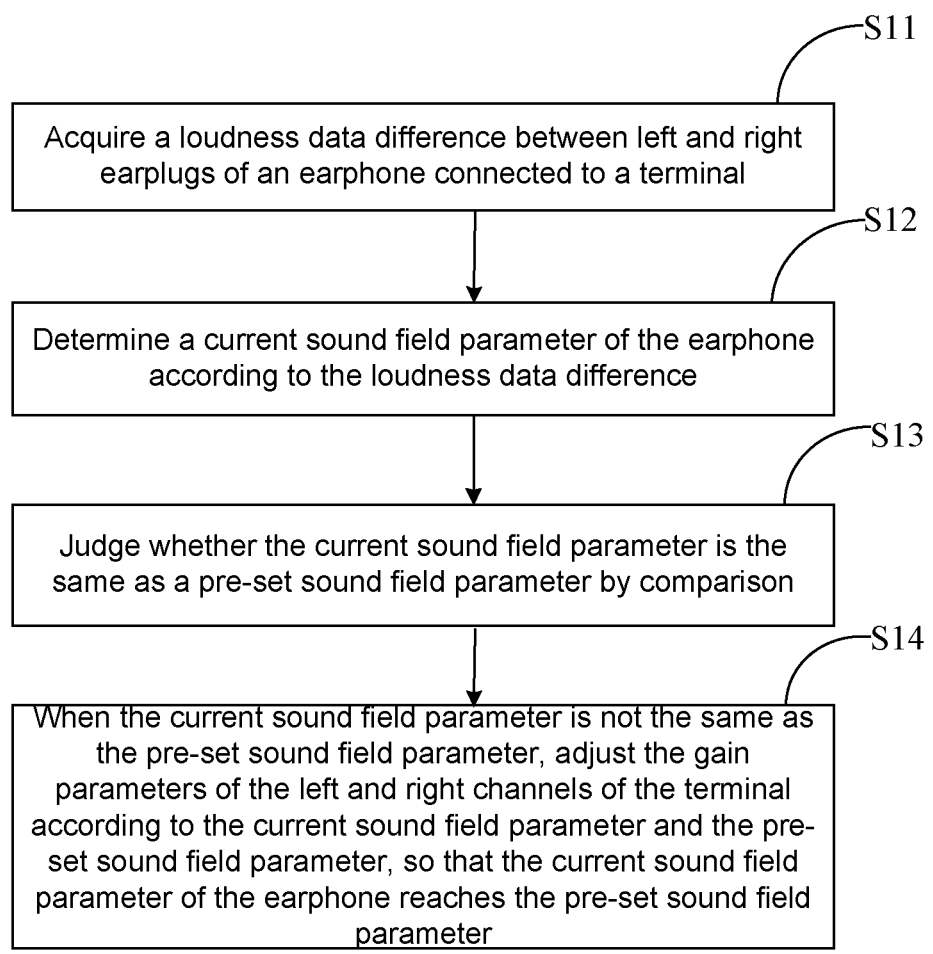
FIG. 1 is a flowchart of a method for adjusting a sound field of an earphone, applied to a terminal, in embodiment one of the present disclosure.

The following is a brief introduction for a subject described in an embodiment in detail. The brief introduction is not intended to restrict the scope of protection of claims.

The exemplary embodiments of the present disclosure will be described below with reference to the drawings in more detail. Although the exemplary embodiments of the present disclosure are displayed in the drawings, it should be understood that the present disclosure may be implemented in various forms and should not be limited by the embodiments elaborated here. On the contrary, these embodiments are provided, in order to understand the present disclosure more thoroughly, and in order to transfer the scope of the present disclosure to those skilled in the art completely.

Embodiment One

As shown in FIG. 1, the embodiment one of the present disclosure provides a method for adjusting a sound field of an earphone, applied to a terminal. The method includes the steps S11 to S13.

In step S11, a loudness data difference between left and right earplugs of an earphone connected to the terminal is acquired.

In the embodiment one of the present disclosure, the terminal may be a terminal device such as a mobile phone and a computer.

In step S12, a current sound field parameter of the earphone is determined according to the loudness data difference.

In the embodiment one of the present disclosure, the loudness data difference is a specific value (such as 5 dB), a sound field parameter may be interpreted as a specific value (such as 5 dB), and therefore the current sound field parameter can be simply determined according to the loudness data difference.

In step S13, it is judged whether the current sound field parameter is the same as a pre-set sound field parameter by comparison.

In step S14, when the current sound field parameter is not the same as the pre-set sound field parameter, gain parameters of left and right channels of the terminal are adjusted according to the current sound field parameter and the pre-set sound field parameter, so that the current sound field parameter of the earphone reaches the pre-set sound field parameter.

In the embodiment one of the present disclosure, a terminal determines, by means of an acquired loudness data difference between left and right earplugs of an earphone connected to the terminal, a current sound field parameter of the earphone, judges whether the current sound field parameter is different from a pre-set sound field parameter by comparison, and changes, when the current sound field parameter is different from the pre-set sound field parameter, gain parameters (namely an amplification factor of a smart audio amplifier) of left and right channels respectively according to a comparison result, so as to adjust a sound field of the earphone, thereby simply and accurately adjusting the sound field of the earphone to a pre-set sound field.

In an embodiment, in the embodiment one of the present disclosure, before the step S13 is executed, the method further includes: acquiring an adjustment instruction input by a user to adjust a sound field parameter; and determining the pre-set sound field parameter according to the adjustment instruction.

In the embodiment one of the present disclosure, the adjustment instruction input by the user may be acquired by making a simple sound field adjustment dynamic operating interface in an audio player of the terminal. For example, adjustment ranges between a middle balance point of the sound field adjustment dynamic operating interface and left and right loudspeakers are set as 15 dB respectively, pace is adjusted in a single grid, each grid is representative of 0.5 dB or 1 dB, or the pace is adjusted as desired. Thus, the terminal may determine a pre-set sound field parameter very simply and quickly according to the adjustment instruction input by the user in the sound field adjustment dynamic operating interface. In an embodiment, when the loudness of music playing in the left loudspeaker of the earphone is the same as the loudness of music playing in the right loudspeaker of the earphone, that is, sound pressures in left and right external auditory canals of ears are consistent, a sound field is located between the left and right loudspeakers. When the loudness of one of the loudspeakers is increased, the sound field will deviate to the large-loudness loudspeaker; and when a loudness difference between the two loudspeakers exceeds 15 dB, the sound field is fixed to the large-loudness loudspeaker, and will not deviate outwards along with increase of the loudness of an audio loudspeaker any longer.

In the embodiment one of the present disclosure, it is understood that the above-mentioned pre-set sound field parameter may be a default value (such as a corresponding sound field parameter when amplification factors of the left and right channels are the same).

In an embodiment, in the embodiment one of the present disclosure, the step S14 specifically includes: firstly, determining a difference value between the current sound field parameter and the pre-set sound field parameter according to the current sound field parameter and the pre-set sound field parameter; then, determining a first adjustment parameter of a smart audio amplifier in the left channel of the terminal and a second adjustment parameter of a smart audio amplifier in the right channel of the terminal according to the difference value and a pre-set mapping function for determining an adjustment parameter of a smart audio amplifier; and finally, adjusting a gain parameter of the left channel through the smart audio amplifier in the left channel according to the first adjustment parameter, and adjusting a gain parameter of the right channel through the smart audio amplifier in the right channel according to the second adjustment parameter.

In the embodiment one of the present disclosure, the pre-set mapping function may be a mapping relationship. That is, the mapping function stores a corresponding relationship between the difference value and the first and second adjustment parameters, for example, the pre-set sound field parameter is that the loudness (volume) of the right channel is larger than the loudness (volume) of the left channel by 10 dB, and the current sound field parameter is that the loudness of the right channel is larger than the loudness of the left channel by 8 dB, so the difference value is 2 dB, and at this time, the second adjustment parameter may be set as:

((current amplification factor of the smart audio amplifier in the right channel−current amplification factor of the smart audio amplifier in the left channel)÷8)×2+the amplification factor of the smart audio amplifier in the right channel.

The first adjustment parameter is the current amplification factor of the smart audio amplifier in the left channel. Therefore, after the difference value is determined, the first adjustment parameter and the second adjustment parameter are determined. Thus, the sound field of the earphone can be adjusted as a pre-set sound field by adjusting the amplification factor of the smart audio amplifier in the left channel according to the first adjustment parameter and adjusting the amplification factor of the smart audio amplifier in the right channel according to the second adjustment parameter.

Embodiment Two

Figure 2:
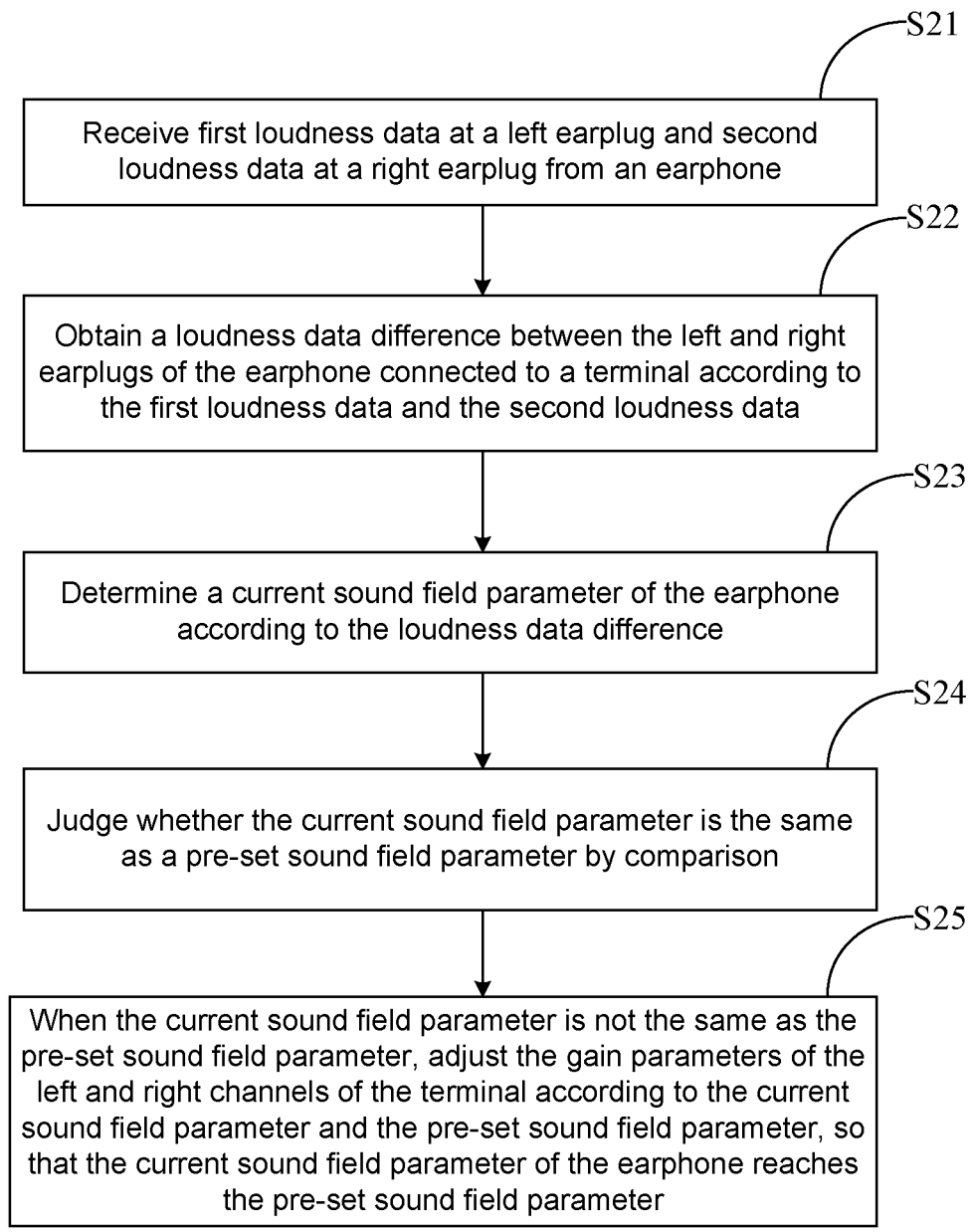
FIG. 2 is a flowchart of a method for adjusting a sound field of an earphone, applied to a terminal, in embodiment two of the present disclosure.

As shown in FIG. 2, the embodiment two of the present disclosure provides a method for adjusting a sound field of an earphone, which is applied to a terminal. The method includes the steps S21 to S25.

In step S21, first loudness data at a left earplug and second loudness data at a right earplug are received from an earphone.

In the embodiment two of the present disclosure, the first loudness data at the left earplug may be received from the earphone under a first pre-set frequency (such as 5 Hz), and the second loudness data at the right earplug may be received from the earphone under a second pre-set frequency (such as 7 Hz). But it is important to note that the first loudness data and the second loudness data cannot be received at the same time. Therefore, the terminal is enabled to control the earphone to collect loudness data at the left and right earplugs, and pre-sets that certain loudness data (such as first loudness data) is received and then another loudness data (such as second loudness data) is received in a next cycle. During specific implementation, a timing clock is added when the earphone collects the loudness data at the left and right earplugs. In an embodiment, after collection of the loudness data is completed for a certain cycle count, in order to make synchronizing clocks in this process consistent, it is necessary to re-enable the collection process.

In step S22, a loudness data difference between the left and right earplugs of the earphone connected to the terminal is obtained according to the first loudness data and the second loudness data.

In the embodiment two of the present disclosure, the terminal may be a terminal device such as mobile phone and a computer.

In step S23, a current sound field parameter of the earphone is determined according to the loudness data difference.

In step S24, it is judged whether the current sound field parameter is the same as a pre-set sound field parameter by comparison.

In step S25, when the current sound field parameter is not the same as the pre-set sound field parameter, gain parameters of left and right channels of the terminal are adjusted according to the current sound field parameter and the pre-set sound field parameter, so that the current sound field parameter of the earphone reaches the pre-set sound field parameter.

In the embodiment two of the present disclosure, a terminal calculates, according to acquired first loudness data at a left earplug of an earphone connected to the terminal and acquired second loudness data at a right earplug, a loudness data difference between the left and right earplugs, determines a current sound field parameter of the earphone according to the loudness data difference, judges whether the current sound field parameter is different from a pre-set sound field parameter by comparison, and changes, when the current sound field parameter is different from the pre-set sound field parameter, amplification factors of smart audio amplifiers in left and right channels respectively according to a comparison result, so as to adjust a sound field of the earphone, thereby simply and accurately adjusting the sound field of the earphone to a pre-set sound field.

Embodiment Three

Figure 3:
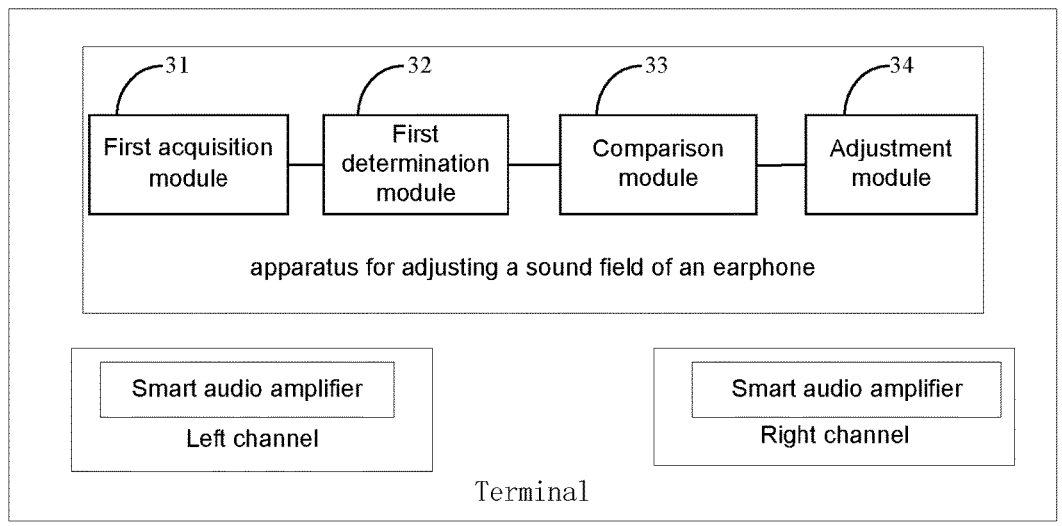
FIG. 3 is a schematic diagram of an apparatus for adjusting a sound field of an earphone, applied to a terminal, in embodiment three of the present disclosure.

As shown in FIG. 3, the embodiment three of the present disclosure provides an apparatus for adjusting a sound field of an earphone, and the apparatus may be used in a terminal. The apparatus includes a first acquisition module 31, a first determination module 32, a comparison module 33 and an adjustment module 34.

The first acquisition module 31 is configured to acquire a loudness data difference between left and right earplugs of an earphone connected to the terminal.

The first determination module 32 is configured to determine a current sound field parameter of the earphone according to the loudness data difference.

The comparison module 33 is configured to judge whether the current sound field parameter is the same as a pre-set sound field parameter by comparison.

The adjustment module 34 is configured to adjust, when the current sound field parameter is not the same as the pre-set sound field parameter, gain parameters of left and right channels of the terminal according to the current sound field parameter and the pre-set sound field parameter, so that the current sound field parameter of the earphone reaches the pre-set sound field parameter.

In an embodiment, the first acquisition module 31 may include a receiving unit and a first determination unit.

The receiving unit is configured to receive first loudness data at the left earplug and second loudness data at the right earplug from the earphone, and the first determination unit, configured to obtain the loudness data difference between the left and right earplugs of the earphone connected to the terminal according to the first loudness data and the second loudness data.

In an embodiment, the receiving unit may include a first sub-unit, and the first sub-unit is configured to receive the first loudness data at the left earplug from the earphone under a first pre-set frequency, and receive the second loudness data at the right earplug from the earphone under a second pre-set frequency.

In an embodiment, the apparatus may further include a second acquisition module and a second determination module. The second acquisition module, configured to acquire an adjustment instruction input by a user to adjust a sound field parameter, and the second determination module, configured to determine the pre-set sound field parameter according to the adjustment instruction.

In an embodiment, the adjustment module 34 may include a second determination unit, a third determination unit and an adjustment unit.

The second determination unit is configured to determine a difference value between the current sound field parameter and the pre-set sound field parameter according to the current sound field parameter and the pre-set sound field parameter. The third determination unit is configured to determine a first adjustment parameter of a smart audio amplifier in the left channel of the terminal and a second adjustment parameter of a smart audio amplifier in the right channel of the terminal according to the difference value and a pre-set mapping function for determining an adjustment parameter of a smart audio amplifier.

The adjustment unit is configured to adjust a gain parameter of the left channel according to the first adjustment parameter, and adjust a gain parameter of the right channel according to the second adjustment parameter.

In the embodiment three of the present disclosure, a terminal determines, by means of an acquired loudness data difference between left and right earplugs of an earphone connected to the terminal, a current sound field parameter of the earphone, judges whether the current sound field parameter is different from a pre-set sound field parameter by comparison, and changes, when the current sound field parameter is different from the pre-set sound field parameter, amplification factors of smart audio amplifiers in left and right channels respectively according to a comparison result, so as to adjust a sound field of the earphone, thereby simply and accurately adjusting the sound field of the earphone to a pre-set sound field.

It is important to note that the apparatus for adjusting a sound field of an earphone provided in the embodiment three of the present disclosure is an apparatus adopting the above-mentioned method for adjusting a sound field of an earphone applied to a terminal. That is, all embodiments for the above-mentioned method are applied to this apparatus, and can achieve the same or similar beneficial effects.

Embodiment Four

The embodiment four of the present disclosure provides a terminal, which may include the above-mentioned apparatus for adjusting a sound field of an earphone.

Embodiment Five

Figure 4:
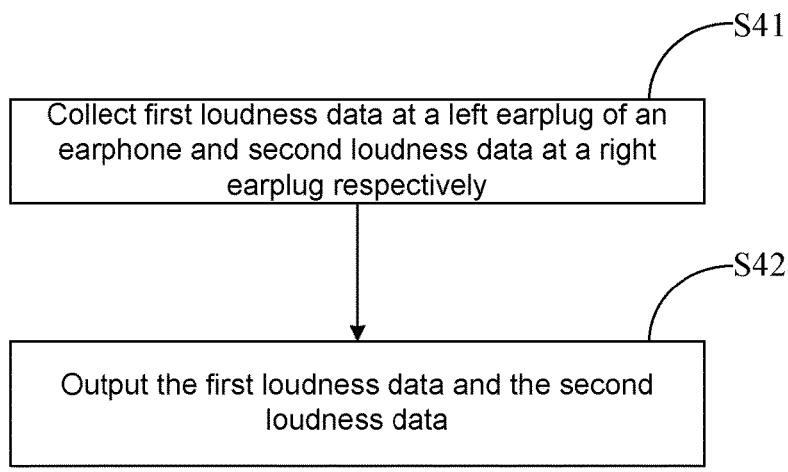
FIG. 4 is a flowchart of a method for adjusting a sound field of an earphone, applied to an earphone, in embodiment five of the present disclosure.

As shown in FIG. 4, the embodiment five of the present disclosure provides a method for adjusting a sound field of an earphone, which can be applied to an earphone. The method includes the steps S41 to S42.

In step S41, first loudness data at a left earplug of the earphone and second loudness data at a right earplug are collected respectively.

In the embodiment five of the present disclosure, the first loudness data at the left earplug of the earphone and the second loudness data at the right earplug may be collected through a Microphone (MIC) respectively.

In step S42, the first loudness data and the second loudness data are output.

In an embodiment, in the embodiment five of the present disclosure, after the step S41 is executed, the method further includes: obtaining a loudness data difference between the left and right earplugs of the earphone according to the first loudness data and the second loudness data; and sending the loudness data difference to a terminal.

In the embodiment five of the present disclosure, after collecting the first loudness data at the left earplug and the second loudness data at the right earplug, the earphone may calculate a loudness data difference between the left and right earplugs of the earphone, and send the loudness data difference to the terminal connected to the earphone, so as to make it convenient for the terminal to adjust a sound field of the earphone, such that the sound field of the earphone reaches a pre-set sound field.

In an embodiment, in the embodiment five of the present disclosure, the step S42 specifically includes: outputting the first loudness data and the second loudness data to the terminal connected to the earphone.

In the embodiment five of the present disclosure, after collecting the first loudness data at the left earplug and the second loudness data at the right earplug, the earphone may directly send the first loudness data and the second loudness data to the terminal connected to the earphone, such that the terminal calculates a loudness data difference between the left and right earplugs of the earphone according to the first loudness data and the second loudness data, and further adjusts a sound field of the earphone according to the loudness data difference, and the sound field of the earphone reaches a pre-set sound field accordingly.

In an embodiment, in the embodiment five of the present disclosure, the first loudness data at the left earplug of the earphone may be sent to the terminal under a first pre-set frequency (such as 5 Hz), and the second loudness data at the right earplug of the earphone may be sent to the terminal under a second pre-set frequency (such as 7 Hz). But it is important to note that the first loudness data and the second loudness data cannot be sent to the terminal at the same time. In order to prevent sending the first loudness data and the second loudness data to the terminal at the same time, the terminal is enabled to control the earphone to collect loudness data at the left and right earplugs, and pre-sets that certain loudness data (such as first loudness data) is received and then another loudness data (such as second loudness data) is received in a next cycle. During specific implementation, a timing clock is added when the earphone collects the loudness data at the left and right earplugs. In an embodiment, after collection of the loudness data is completed for a certain cycle count, in order to make synchronizing clocks in this process consistent, it is necessary to re-enable the collection process.

Embodiment Six

Figure 5:
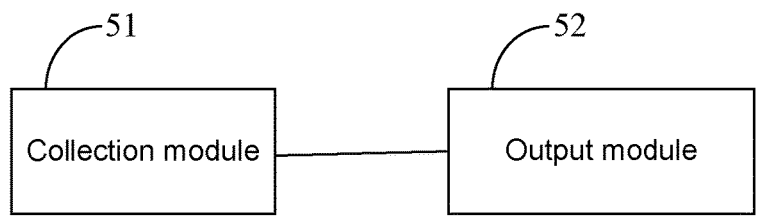
FIG. 5 is a schematic diagram of an apparatus for adjusting a sound field of an earphone, applied to an earphone, in embodiment six of the present disclosure.

As shown in FIG. 5, the embodiment six of the present disclosure provides an apparatus for adjusting a sound field of an earphone, which can be applied to an earphone. The apparatus may include a collection module 51 and an output module 52.

The collection module 51 is configured to collect first loudness data at a left earplug of the earphone and second loudness data at a right earplug respectively, and the output module 52 is configured to output the first loudness data and the second loudness data.

In an embodiment, the apparatus may further include a third determination module and a sending module. The third determination module is configured to obtain a loudness data difference between the left and right earplugs of the earphone according to the first loudness data and the second loudness data. The sending module, configured to send the loudness data difference to a terminal.

In an embodiment, the output module 52 may include an output unit, and the output unit is configured to output the first loudness data and the second loudness data to the terminal connected to the earphone.

In an embodiment, the output unit may include an output sub-unit. The output sub-unit is configured to send the first loudness data at the left earplug of the earphone to the terminal under a first pre-set frequency, and send the second loudness data at the right earplug of the earphone to the terminal under a second pre-set frequency.

It is important to note that the apparatus for adjusting a sound field of an earphone provided in the embodiment six of the present disclosure is an apparatus adopting the above-mentioned method for adjusting a sound field of an earphone applied to an earphone. That is, all embodiments for the above-mentioned method are applied to this apparatus, and can achieve the same or similar beneficial effects.

Seventh Embodiment

The seventh embodiment of the present disclosure provides an earphone, which includes the above-mentioned apparatus for adjusting a sound field of an earphone.

The embodiment of the present disclosure also discloses a computer program, which includes a program instruction. When the program instruction is executed by a terminal, the terminal may execute the method for adjusting a sound field of an earphone at a terminal side according to any of the above-mentioned contents.

The embodiment of the present disclosure also discloses a carrier carrying the computer program.

The embodiment of the present disclosure also discloses a computer program, which includes a program instruction. When the program instruction is executed by an earphone, the earphone may execute the method for adjusting a sound field of an earphone at an earphone side according to any of the above-mentioned contents.

The embodiment of the present disclosure also discloses a carrier carrying the computer program.

After the drawings and the detailed descriptions are read and understood, other aspects may be understood.

The above is only exemplary implementation modes of the present disclosure. It should be pointed out that those skilled in the art can also make some improvements and modifications without departing from the principle of the present disclosure. These improvements and modifications should fall within the scope of protection of the present disclosure.

What is claimed is:

1. A method for adjusting a sound field of an earphone, applied to a terminal, the method comprising:
   acquiring a loudness data difference between left and right earplugs of an earphone connected to the terminal;
   determining a current sound field parameter of the earphone according to the loudness data difference;
   judging whether the current sound field parameter is the same as a pre-set sound field parameter by comparison; and
   when the current sound field parameter is not the same as the pre-set sound field parameter, adjusting gain parameters of left and right channels of the terminal according to the current sound field parameter and the pre-set sound field parameter, so that the current sound field parameter of the earphone reaches the pre-set sound field parameter;
   wherein the step of adjusting gain parameters of left and right channels of the terminal according to the current sound field parameter and the pre-set sound field parameter comprises:
   determining a difference value between the current sound field parameter and the pre-set sound field parameter according to the current sound field parameter and the pre-set sound field parameter;
   determining a first adjustment parameter of a smart audio amplifier in the left channel of the terminal and a second adjustment parameter of a smart audio amplifier in the right channel of the terminal according to the difference value and a pre-set mapping function for determining an adjustment parameter of a smart audio amplifier; and
   adjusting a gain parameter of the left channel according to the first adjustment parameter, and adjusting a gain parameter of the right channel according to the second adjustment parameter.

2. The method as claimed in claim 1, wherein the step of acquiring a loudness data difference between left and right earplugs of an earphone connected to the terminal comprises:
   receiving first loudness data at the left earplug and second loudness data at the right earplug from the earphone; and
   obtaining the loudness data difference between the left and right earplugs of the earphone connected to the terminal according to the first loudness data and the second loudness data.

3. The method as claimed in claim 2, wherein the step of receiving first loudness data at the left earplug and second loudness data at the right earplug from the earphone comprises:
   receiving the first loudness data at the left earplug from the earphone under a first pre-set frequency, and receiving the second loudness data at the right earplug from the earphone under a second pre-set frequency.

4. The method as claimed in claim 1, wherein before judging whether the current sound field parameter is the same as a pre-set sound field parameter by comparison, the method further comprises:
   acquiring an adjustment instruction input by a user to adjust a sound field parameter; and
   determining the pre-set sound field parameter according to the adjustment instruction.

5. An apparatus for adjusting a sound field of an earphone, applied to a terminal, the apparatus comprising a first acquisition module, a first determination module, a comparison module and an adjustment module, wherein
   the first acquisition module is configured to acquire a loudness data difference between left and right earplugs of an earphone connected to the terminal;
   the first determination module is configured to determine a current sound field parameter of the earphone according to the loudness data difference;
   the comparison module is configured to judge whether the current sound field parameter is the same as a pre-set sound field parameter by comparison; and
   the adjustment module is configured to adjust, when the current sound field parameter is not the same as the pre-set sound field parameter, gain parameters of left and right channels of the terminal according to the current sound field parameter and the pre-set sound field parameter, so that the current sound field parameter of the earphone reaches the pre-set sound field parameter;
   wherein the adjustment module comprises a second determination unit, a third determination unit and an adjustment unit, wherein
   the second determination unit is configured to determine a difference value between the current sound field parameter and the pre-set sound field parameter according to the current sound field parameter and the pre-set sound field parameter;
   the third determination unit is configured to determine a first adjustment parameter of a smart audio amplifier in the left channel of the terminal and a second adjustment parameter of a smart audio amplifier in the right channel of the terminal according to the difference value and a pre-set mapping function for determining an adjustment parameter of a smart audio amplifier; and the adjustment unit is configured to adjust a gain parameter of the left channel according to the first adjustment parameter, and adjust a gain parameter of the right channel according to the second adjustment parameter.

6. The apparatus as claimed in claim 5, wherein the first acquisition module comprises a receiving unit and a first determination unit, wherein the receiving unit is configured to receive first loudness data at the left earplug and second loudness data at the right earplug from the earphone; and the first determination unit is configured to obtain the loudness data difference between the left and right earplugs of the earphone connected to the terminal according to the first loudness data and the second loudness data.

7. The apparatus as claimed in claim 6, wherein the receiving unit comprises a first sub-unit, wherein the first sub-unit is configured to receive the first loudness data at the left earplug from the earphone under a first pre-set frequency, and receive the second loudness data at the right earplug from the earphone under a second pre-set frequency.

8. The apparatus as claimed in claim 5, further comprising a second acquisition module and a second determination module, wherein the second acquisition module is configured to acquire an adjustment instruction input by a user to adjust a sound field parameter; and the second determination module is configured to determine the pre-set sound field parameter according to the adjustment instruction.

* * * * *